(12) United States Patent
Basker et al.

(10) Patent No.: US 8,043,966 B2
(45) Date of Patent: Oct. 25, 2011

(54) METHOD FOR MONITORING PATTERNING INTEGRITY OF ETCHED OPENINGS AND FORMING CONDUCTIVE STRUCTURES WITH THE OPENINGS

(75) Inventors: Veeraraghavan S. Basker, Albany, NY (US); Toshiharu Furukawa, Essex Junction, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 842 days.

(21) Appl. No.: 12/101,329

(22) Filed: Apr. 11, 2008

(65) Prior Publication Data

US 2009/0255818 A1    Oct. 15, 2009

(51) Int. Cl.
*H01L 21/44* (2006.01)

(52) U.S. Cl. ........ 438/678; 438/128; 438/131; 438/600; 438/618; 438/622; 438/687; 438/688; 257/E21.117

(58) Field of Classification Search .................. None
See application file for complete search history.

(56) References Cited

U.S. PATENT DOCUMENTS

| | | | |
|---|---|---|---|
| 4,943,538 A | 7/1990 | Mohsen et al. | |
| 5,789,795 A | 8/1998 | Sanchez et al. | |
| 5,793,094 A | 8/1998 | Sanchez et al. | |
| 6,124,194 A | 9/2000 | Shao et al. | |
| 6,156,588 A | 12/2000 | Sanchez et al. | |
| 6,300,244 B1 | 10/2001 | Itacashi et al. | |
| 6,335,228 B1 | 1/2002 | Fuller et al. | |
| 6,596,149 B2 | 7/2003 | Horii | |
| 6,638,794 B2 | 10/2003 | Tseng | |
| 6,756,624 B2 | 6/2004 | Petrarca et al. | |
| 6,777,761 B2 | 8/2004 | Clevenger et al. | |
| 6,904,674 B2 | 6/2005 | Mune et al. | |
| 7,033,867 B2 | 4/2006 | Porter | |
| 7,115,493 B2 | 10/2006 | Forbes et al. | |
| 7,198,965 B2 | 4/2007 | He | |
| 2004/0084320 A1 * | 5/2004 | Wong | 205/123 |

OTHER PUBLICATIONS

U.S. Appl. No. 11/968,885, Basker et al.
U.S. Appl. No. 12/031,761, Basker et al.
Andricacos et al, "Damascene Copper Electroplating for Chip Interconnections," IBM Journal of Research and Development, vol. 42, and No. 5, 1998, pp. 1-9.

* cited by examiner

*Primary Examiner* — N Drew Richards
*Assistant Examiner* — Kyoung Lee
(74) *Attorney, Agent, or Firm* — Gibb I.P. Law Firm, LLC; Anthony Canale

(57) ABSTRACT

Disclosed are embodiments of a method that both monitors patterning integrity of etched openings (i.e., ensures that lithographically patterned and etched openings are complete) and forms on-chip conductive structures (e.g., contacts, interconnects, fuses, anti-fuses, capacitors, etc.) within such openings. The method embodiments incorporate an electro-deposition process to provide both the means by which pattern integrity of etched openings can be monitored and also the metallization required for the formation of conductive structures within the openings. Specifically, during the electro-deposition process, electron flow is established by applying a current to the back side of the semiconductor wafer, thus, eliminating the need for a seed layer. Electron flow through the wafer and into the electroplating solution is then monitored and used as an indicator of electroplating in the etched openings and, thereby, as an indicator that the openings are completely etched.

20 Claims, 11 Drawing Sheets

METHOD FOR MONITORING PATTERNING INTEGRITY OF ETCHED OPENINGS AND FORMING CONDUCTIVE STRUCTURES WITH THE OPENINGS

BACKGROUND OF THE INVENTION

The embodiments of the invention generally relate to techniques for monitoring patterning integrity and, more particularly, to a technique that uses an electro-deposition process to both monitor patterning integrity of etched openings and to form conductive structures within the etched openings.

DESCRIPTION OF RELATED ART

As semiconductor chip manufacturing technology shrinks to the 32 nm node and beyond, conventional inspection techniques (e.g., bright field (BF) or dark field (DF) inspection) are no longer adequate to determine the integrity of patterning in the different metal levels. For example, at the contact level, dimensions have been scaled down to a 100 nm pitch. Unfortunately, conventional inspection techniques cannot easily pick up missing vias at such small dimensions. That is, the conventional inspection techniques can not detect whether vias are fully etched such that they extend through a dielectric layer to a semiconductor layer and, more particularly, to a diffusion region of a semiconductor layer requiring a contact. Thus, there is a need in the art for improved techniques to address this issue.

SUMMARY OF THE INVENTION

In view of the foregoing, disclosed herein are embodiments of a method that both monitors patterning integrity of etched openings and forms on-chip conductive structures (e.g., contacts, interconnects, fuses, anti-fuses, capacitors, etc.) within such openings. The method embodiments incorporate an electro-deposition process to provide both the means by which pattern integrity of etched openings can be monitored and also the metallization required for the formation of conductive structures within such openings. Specifically, during the electro-deposition process, electron flow is established by applying current to the back side of the semiconductor wafer, thus, eliminating the need for a seed layer. Electron flow through the wafer and into the electroplating solution is then monitored and used as an indicator of electroplating in the etched openings and, thereby, as an indicator that the openings are completely etched.

More particularly, the method embodiments comprise providing a substrate with a conductive portion at the top surface. A dielectric layer is formed on the top surface of the substrate adjacent to the conductive portion. Then, lithographic patterning and etch processes are used to form an opening in the dielectric layer aligned above the conductive portion. Following the lithographic patterning and etch processes, an electroplating process is performed using an electroplating solution and a current applied to the substrate such that an electron flow is established through the substrate and to the conductive portion. This electroplating process can be performed under illumination so as to enhance electron flow and to ensure that the electron flow passes to the conductive portion.

Additionally, during this electroplating process, electron flow from the conductive portion of the substrate into the electroplating solution is monitored. Electron flow into the electroplating solution will result in plating on the conductive portion of the substrate within the etched opening and, thus, is an indication that the opening extends through the dielectric layer down to the conductive portion. If plating does not occur, then the etching, electroplating and monitoring processes are repeated. If plating does occur, the electroplating process can be continued in order to fill the remaining portion of the opening with at least one conductive material, thereby completing formation of the conductive structure. Alternatively, if plating occurs, the electroplating process can be terminated and the remaining portion of the opening can be filled with at least one conductive material using an alternative deposition process, thereby completing formation of the conductive structure.

For example, one particular embodiment of the method can be used to form a contact on a semiconductor chip. This embodiment comprises providing a semiconductor substrate (e.g., a semiconductor wafer) with a diffusion region exposed at the top surface. A dielectric layer is formed on the top surface of the semiconductor substrate adjacent to the diffusion region. Then, lithographic patterning and etch processes are performed in order to form a contact opening in the dielectric layer aligned above the diffusion region. Following the lithographic patterning and etch processes, an electroplating process is performed using an electroplating solution and a current applied to the semiconductor substrate such that an electron flow is established through the semiconductor substrate and to the diffusion region. This electroplating process can be performed under illumination so as to enhance electron flow and ensure that the electron flow passes to the diffusion region.

Additionally, during the electroplating process, the flow of electrons into the electroplating solution is monitored. As discussed above, electron flow into the electroplating solution will cause plating to occur on the diffusion region within the contact opening and is an indication that the contact opening extends through the dielectric layer down to the diffusion region. If plating does not occur, then the etching, electroplating and monitoring processes are repeated. If plating does occur, the electroplating process can be continued in order to fill the remaining portion of the contact opening with at least one conductive material, thereby completing contact formation. For example, the electroplating process can comprise performing a first electroplating process in order to plate a barrier metal layer in the contact opening on the diffusion region. Once plating of the barrier metal layer occurs, a second electroplating process can be performed in order to plate an additional metal layer (e.g., a contact metal layer) in the contact opening on the barrier metal layer. Alternatively, if plating occurs, the electroplating process can be terminated and the remaining portion of the contact opening can be filled with at least one conductive material using an alternative deposition process, thereby completing contact formation. For example, the electroplating process can comprise plating a barrier metal layer in the contact opening on the diffusion region. Once plating of the barrier metal layer occurs, then an additional metal layer (e.g., a contact metal layer) can be deposited in the contact opening on the barrier metal layer.

The method embodiments are not, however, limited to contact level metallization. That is, the method embodiments can also be used to form various other types of conductive structures (e.g., interconnects, fuses, anti-fuses, capacitors, etc.) at all metal levels (e.g., M1, V1, M2, etc.). For example, another method embodiment also comprises providing a substrate. However, in this case, the substrate comprises a semiconductor layer (e.g., a semiconductor wafer) and a metal layer above and electrically connected to (e.g., by one or more interconnects and, as necessary, additional metal layers) to the semiconductor layer.

A dielectric layer is formed on the top surface of the substrate adjacent to the metal layer. Then, lithographic patterning and etch processes are performed in order to form an opening in the dielectric layer aligned above the metal layer. Following the etch process, an electroplating process is performed using an electroplating solution and a current applied to the semiconductor layer such that an electron flow is established through the semiconductor layer (and, if necessary, any intervening interconnects and/or additional metal layers) to the subject metal layer. This electroplating process can be performed under illumination so as to enhance electron flow and ensure that the electron flow passes to the subject metal layer.

As with the previously described embodiment, during the electroplating process, the flow of electrons into the electroplating solution is monitored. If plating does not occur, then the etching, electroplating and monitoring processes are repeated. If plating does occur, the electroplating process can be continued in order to fill the remaining portion of the opening with at least one conductive material, thereby completing formation of the conductive structure. Alternatively, if plating occurs, the electroplating process can be terminated and the remaining portion of the opening can be filled with at least one conductive material using an alternative deposition process, thereby completing formation of the conductive structure.

Consequently, the disclosed method can be used to form any number of middle of the line (MOL) and back end of the line (BEOL) on-chip conductive structures, including but not limited to, contacts, interconnects, anti-fuses, fuses, capacitors, etc. Furthermore, due to the electroplating, monitoring and repeating (as necessary) steps that are incorporated into this method, improved fabrication yield of such conductive structures (e.g., approximately 100% yield) is assured.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments without departing from the spirit thereof, and the embodiments include all such changes and modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
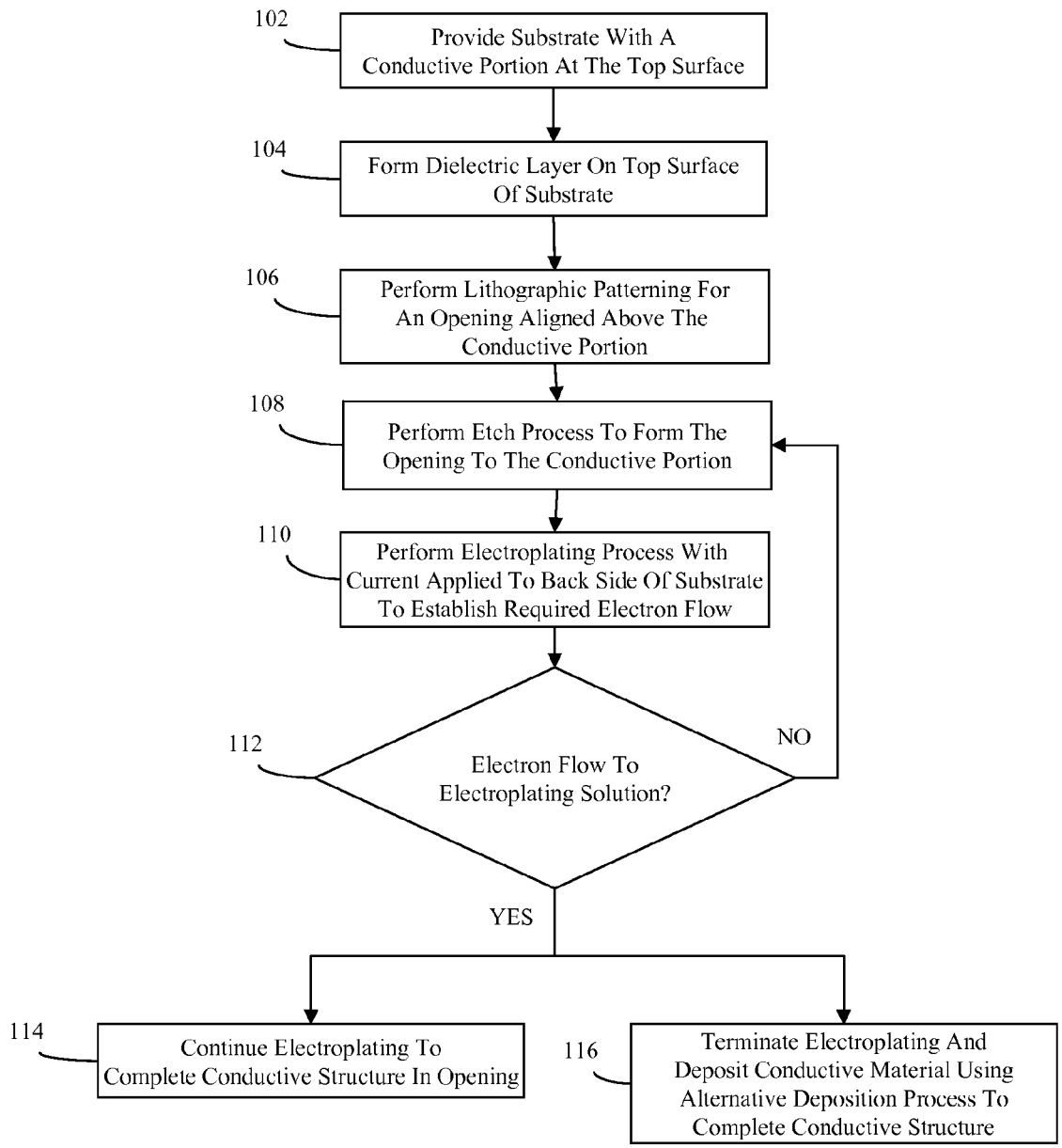
FIG. 1 is a flow diagram illustrating an embodiment of a method of the present invention.
Figure 2:
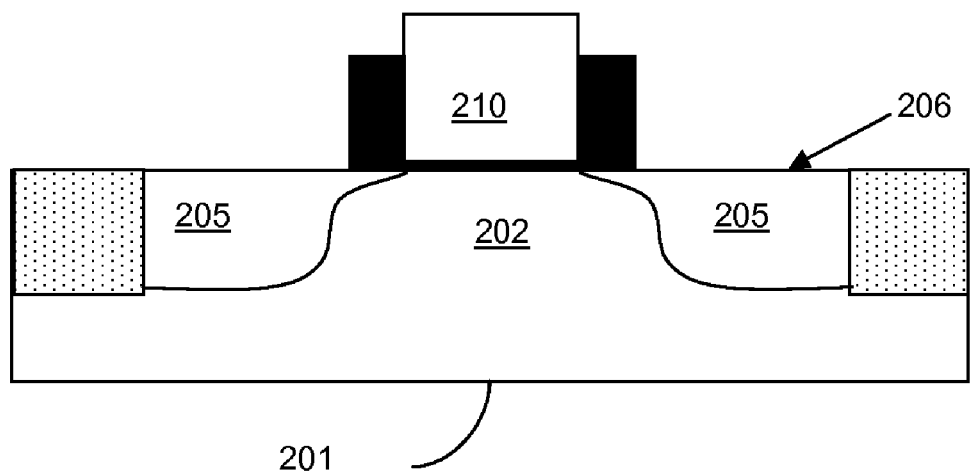
FIG. 2 is a cross-section diagram illustrating a process step in the method of FIG. 1 used to form a contact to a diffusion region of a semiconductor substrate.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, with semiconductor chip manufacturing technology continuing to shrink to the 32 nm node and beyond, conventional inspection techniques (e.g., bright field (BF) or dark field (DF) inspection) are no longer adequate to determine the integrity of patterning in the different metal levels. For example, at the contact level, dimensions have been scaled down to a 100 nm pitch. Unfortunately, the conventional inspection techniques cannot easily pick up missing vias at such small dimensions. That is, the conventional inspection techniques can not detect whether vias are fully etched such that they extend through a dielectric layer to a semiconductor layer and, more particularly, to a diffusion region of a semiconductor layer requiring a contact. Thus, there is a need in the art for improved techniques to address this issue.

In view of the foregoing, disclosed herein are embodiments of a method that both monitors patterning integrity of etched openings (i.e., ensures that lithographically patterned and etched openings are complete) and forms on-chip conductive structures (e.g., contacts, interconnects, fuses, anti-fuses, capacitors, etc.) within such openings. The method embodiments incorporate an electro-deposition process (i.e., an electroplating process) to provide both the means by which pattern integrity of etched openings can be monitored and also the metallization required for the formation of conductive structures within such openings. Specifically, during the electro-deposition process, electron flow is established by applying current to the back side of the semiconductor wafer, thus, eliminating the need for a seed layer. Electron flow through the wafer and into the electroplating solution is then monitored and used as an indicator of electroplating in the etched openings and, thereby, as an indicator that the openings are completely etched.

More particularly, those skilled in the art will recognize that an electroplating circuit typically includes an anode (i.e., a source of metal or alloy), a cathode (i.e., an item to be electroplated with the metal or alloy), an electroplating bath for holding an electroplating solution into which the anode and cathode are submerged and an external power supply connected to the anode and cathode so as to provide a current flow through the circuit. Specifically, the current flow through the circuit and, thereby, electron flow through the cathode and into the electroplating solution will cause metal ions in the electroplating solution to lose their charge and plate onto the cathode. Electro-deposition processes, which incorporate this type of circuit, are often used to form back end of the line (BEOL) features, such as wires, metal-insulator-metal devices, capacitors, etc., on a semiconductor wafer. For example, as described in "Damascene copper electroplating for chip interconnections" by Andricacos et. al, IBM Journal of Research and Development, Vol. 42, No. 5, 1998, various techniques can be used for forming a BEOL electroplated feature on a semiconductor wafer, each of which require the use of a contacted seed layer (i.e., a thinly deposited conductive layer) to provide a current path from the power supply to the cathode (i.e., from the power supply to the area of the wafer that is to be electroplated).

Recently, electroplating techniques have been developed that eliminate the need for such a contacted seed layer. For example, see U.S. patent application Ser. No. 12/031,761 of Basker et al., filed on Feb. 15, 2008 and incorporated herein by reference, which discloses the use of current applied to a contact on the back side of a semiconductor wafer during an electro-deposition process to establish electron flow for the formation and programming of back end of the line (BEOL) in-via anti-fuse devices. See also U.S. patent application Ser. No. 11/968,885 of Basker et al., filed on Jan. 3, 2008 and incorporated herein by reference, which discloses the use of current applied to the back side of a semiconductor wafer during an electro-deposition process in order to form metal replacement gates. The method embodiments of the present invention take advantage of such no-seed layer techniques.

Specifically, the method embodiments of the present invention use a similar electro-deposition technique that establishes electron flow, during an electro-deposition process, by applying current to the back side of the semiconductor wafer, thereby eliminating the need for a seed layer. In doing so, the method embodiments allow the electro-deposition process to be used, not only for metallization, but also to monitor patterning integrity.

More specifically, referring to FIG. 1, the method embodiments of the present invention comprise providing a substrate (e.g., a semiconductor wafer) with a conductive portion (e.g., a diffusion region, a metal layer, etc.) at the top surface (102). A dielectric layer is formed on the top surface of the substrate adjacent to the conductive portion (104). Then, lithographic patterning and etch processes are used to form an opening in the dielectric layer aligned above the conductive portion (106-108). Following the lithographic patterning and etch processes, an electroplating process is performed using an electroplating solution and a current applied to the substrate (e.g., applied to the back side of the semiconductor wafer directly or to a contact located on the back side of the semiconductor wafer) such that an electron flow is established through the substrate and to the conductive portion (110). It should be understand that for an electrical path must be established through the substrate to the conductive portion. Additionally, this electroplating process can be performed under illumination so as to enhance electron flow and ensure that the electron flow passes to the conductive portion of the substrate.

Additionally, during this electroplating process, electron flow from the conductive portion of the substrate into the electroplating solution is monitored (112). Those skilled in the art will recognize that electron flow into the electroplating solution will result in plating on the conductive portion of the substrate within the etched opening. Since plating will only occur, if an electrical path is open for current flow, the occurrence of electroplating is an indication that the opening extends through the dielectric layer down to the conductive portion of the substrate. If plating does not occur (i.e., if the flow of electrons does not pass into the electroplating solution, due to underetch), then the etching, electroplating and monitoring processes are repeated (108-112). It should be noted that, if the etching process must be repeated, either the chemical composition used for performing the etch process or the time period of the etch process can be varied so as to ensure that the etch process will not fail again. If plating does occur (i.e., if the flow of electrons does pass into the electroplating solution), the electroplating process can be continued in order to fill the remaining portion of the opening with at least one conductive material (i.e., the same material or one or more different materials), thereby completing formation of the conductive structure (114). Alternatively, if plating occurs, the electroplating process can be terminated and the remaining portion of the opening can be filled with at least one conductive material (i.e., either the same material or one or more different materials) using an alternative deposition process, thereby completing formation of the conductive structure (116).

For example, one particular embodiment of the method of the present invention can be used to form a contact on a semiconductor chip. More specifically, this embodiment can be used to form a contact to a diffusion region of a device. For example, it can be used to form a contact to an n-type or p-type doped source/drain region 205 of a field effect transistor (e.g., as illustrated in FIGS. 2-9), a contact to an n-type or p-type doped region of a pn-junction diode, etc.

At process step 102 of FIG. 1, this embodiment comprises providing a semiconductor substrate 201 (e.g., a semiconductor wafer, such as a bulk silicon wafer) with a diffusion region 205 exposed at the top surface 206. For example, a field effect transistor can be formed in the substrate 201 with doped source/drain regions 205 on either side of a channel region 202 within the substrate 201 and with a gate electrode 210 above the channel region 202.

Figure 3:
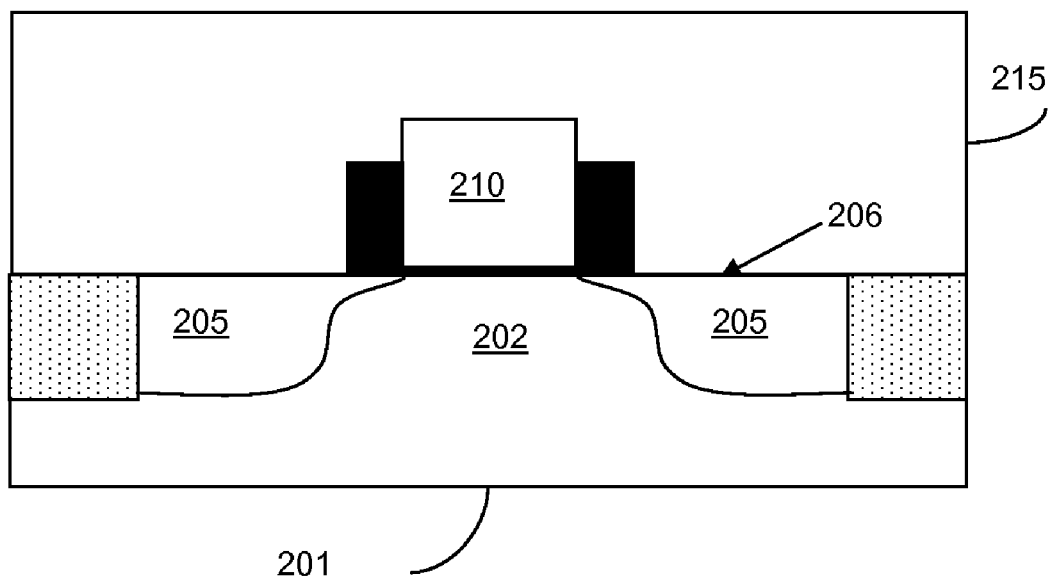
FIG. 3 is a cross-section diagram illustrating a process step in the method of FIG. 1 used to form a contact to a diffusion region of a semiconductor substrate.
Figure 4:
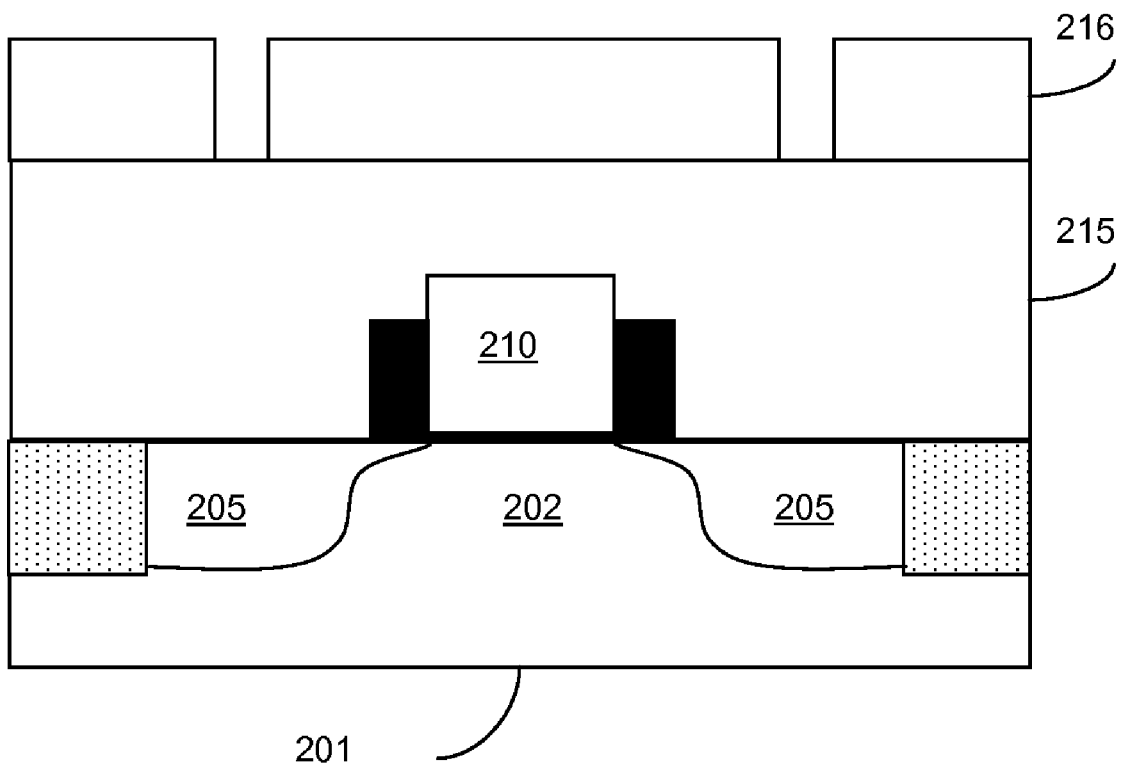
FIG. 4 is a cross-section diagram illustrating a process step in the method of FIG. 1 used to form a contact to a diffusion region of a semiconductor substrate.
Figure 5A:
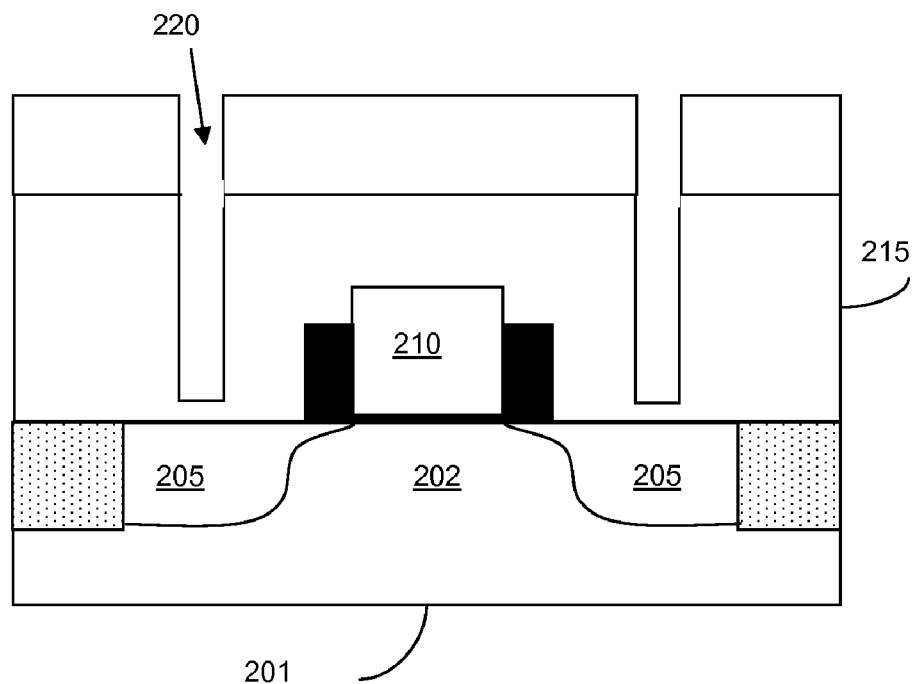
FIG. 5a is a cross-section diagram illustrating a process step in the method of FIG. 1 used to form a contact to a diffusion region of a semiconductor substrate.
Figure 5B:
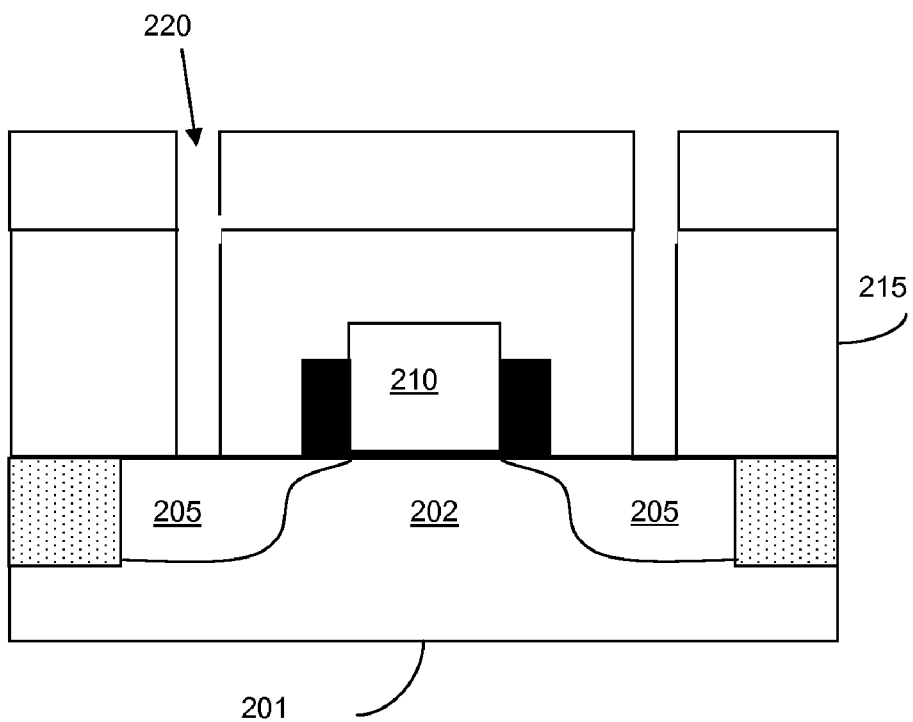
FIG. 5b is a cross-section diagram illustrating a process step in the method of FIG. 1 used to form a contact to a diffusion region of a semiconductor substrate.

At process step 104 of FIG. 1, a dielectric layer 215 (e.g., a silicon dioxide layer or other suitable inter level dielectric) is formed on the top surface 206 of the semiconductor substrate 210 adjacent to (i.e., immediately above) the diffusion region 205 (see FIG. 3). Then, at process steps 106-108, conventional lithographic patterning and etch processes are performed in order to form a contact opening 220 in the dielectric layer such that the opening 220 is aligned above the diffusion region 205. Specifically, a photoresist layer 216 is formed and lithographically patterned (see FIG. 4). Next, an etch process (e.g., a reactive ion etch (RIE) process is performed so as to form the contact opening 220 in the dielectric layer 215. The RIE process is designed to open the dielectric layer 215 and expose the diffusion region 205 at the top surface 206 of the substrate 201, as illustrated in FIG. 5b. However, due to varying etch process conditions, the resulting opening 220 may not in fact extend to the diffusion region 205 (i.e., patterning integrity may be comprised), as illustrated in FIG. 5a. The present invention, therefore, incorporates the following electroplating process that is used to both determine patterning integrity of such contact openings and to ensure improved fabrication yield (e.g., approximately 100% fabrication yield).

That is, at process 110 of FIG. 1, following the lithographic patterning and etch processes 106-108, an electroplating process is performed using an electroplating solution and a current applied to the semiconductor substrate (e.g., applied to the back side of the semiconductor wafer directly or applied to a contact on the back side of the semiconductor wafer from an external power source) such that an electron flow is established through the semiconductor substrate and to the diffusion region. Specifically, referring to FIG. 6, an exemplary electroplating circuit 600 which can be used includes an anode 620 (i.e., a source of metal or alloy), a cathode (i.e., in this case the contact opening 220 to be electroplated on the resulting wafer structure of FIG. 5a or 5b), a rack 615 for holding the wafer structure of FIG. 5a or 5b, an electroplating bath 650 for holding an electroplating solution 660 into which the anode 620 and rack 615 will be submerged, and an external power supply 610 connected to the anode 620 and also connected via the rack 615 to the back side 207 of wafer so as to provide a current flow through the circuit 600. Current flow through the circuit 600 and, thereby, electron flow 611 through the cathode and into the electroplating solution 660 will cause metal ions 612 in the electroplating solution 660 to lose their charge and plate onto the cathode. This electroplating process can be performed under illumination, as illustrated, so as to enhance electron flow and ensure that the electron flow 611 passes to the diffusion region 205.

Additionally, during the electroplating process, at process 112 of FIG. 1, the flow of electrons into the electroplating solution 660 is monitored. For example, a conventional measuring device 640 can be adapted to measure the flow of electrons into the electroplating solution 660 (i.e., to measure the change in charge of the electroplating solution 660). As discussed above, electron flow 611 into the electroplating solution 660 will cause plating 702 to occur on the exposed diffusion region 205 within the contact opening 220 (i.e., at the bottom surface 701 of the opening 220). Since plating will only occur, if an electrical path is open for current flow, the occurrence of electroplating is an indication that the contact opening 220 does in fact extend through the dielectric layer 215 down to the diffusion region 205, as illustrated in FIG. 7b.

Figure 7A:
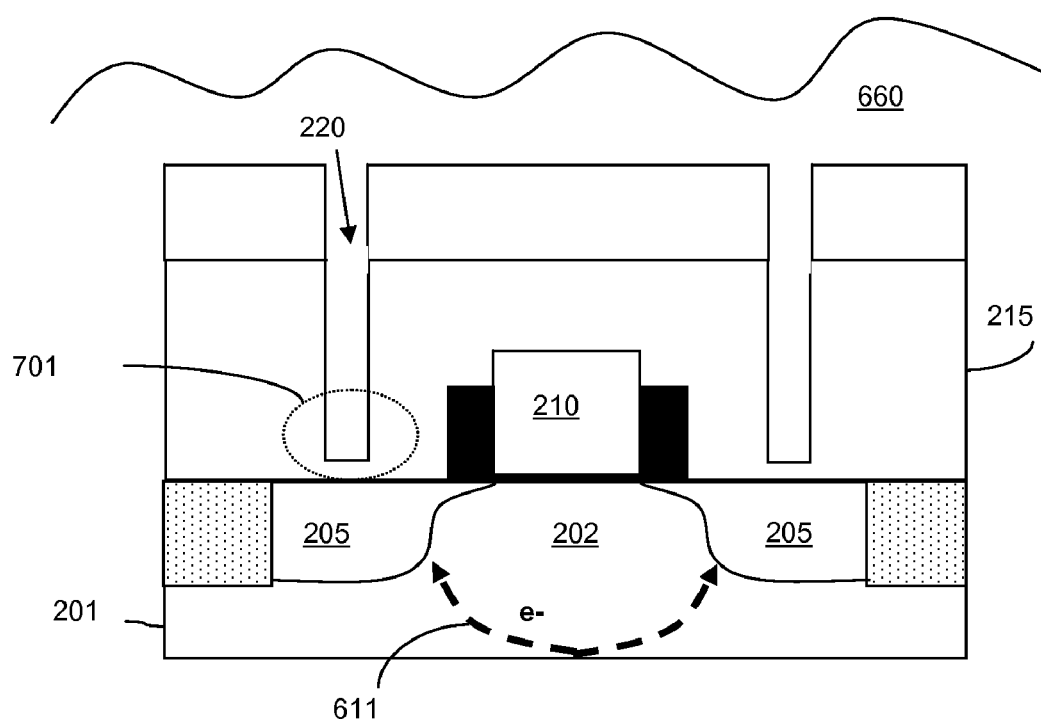
FIG. 7a is a cross-section diagram illustrating a process step in the method of FIG. 1 used to form a contact to a diffusion region of a semiconductor substrate.

If plating does not occur (i.e., if the flow of electrons 611 does not pass into the electroplating solution 660, due to underetch, as determined at process 112 of FIG. 1 and illustrated in FIG. 7a), then the etching, electroplating and monitoring processes 106-112 of FIG. 1 are repeated. That is, the electroplating solution 660 is removed, additional etching takes place, the electroplating solution 660 is reapplied and additional monitoring is performed to again verify the integrity of the contact openings 220. It should be noted that, if the etching process must be repeated, either the chemical composition used for performing the etch process or the time period of the etch process can be varied so as to ensure that the etch process will not fail.

Figure 7B:
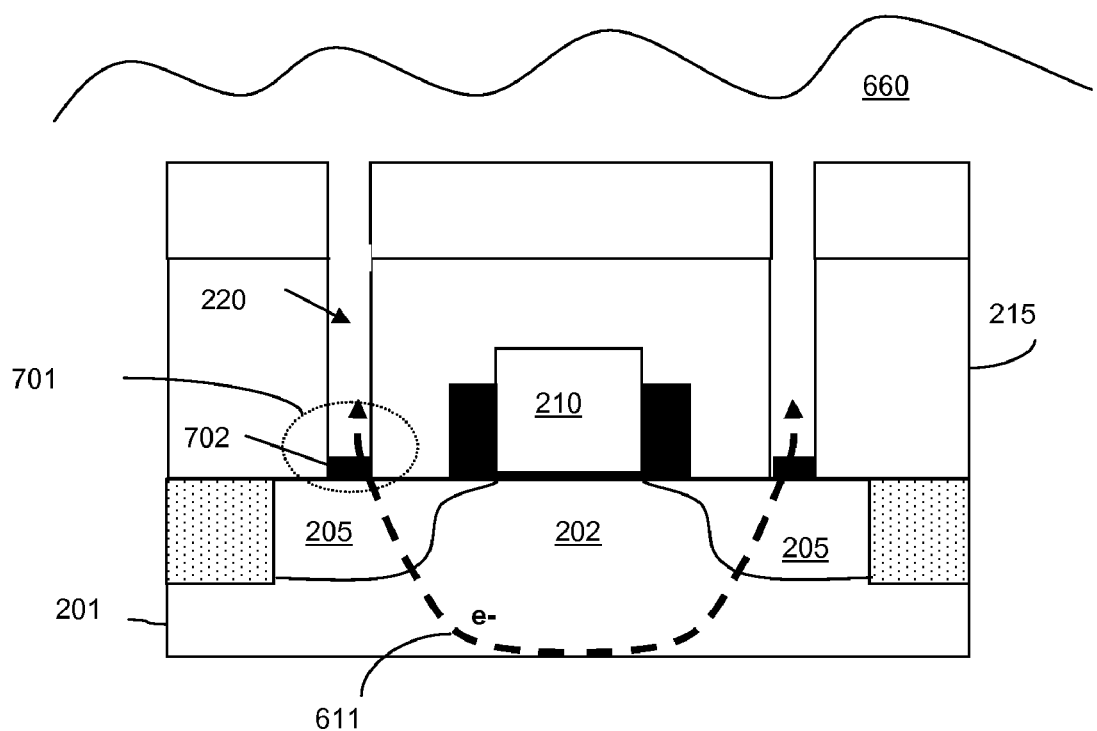
FIG. 7b is a cross-section diagram illustrating a process step in the method of FIG. 1 used to form a contact to a diffusion region of a semiconductor substrate.
Figure 8:
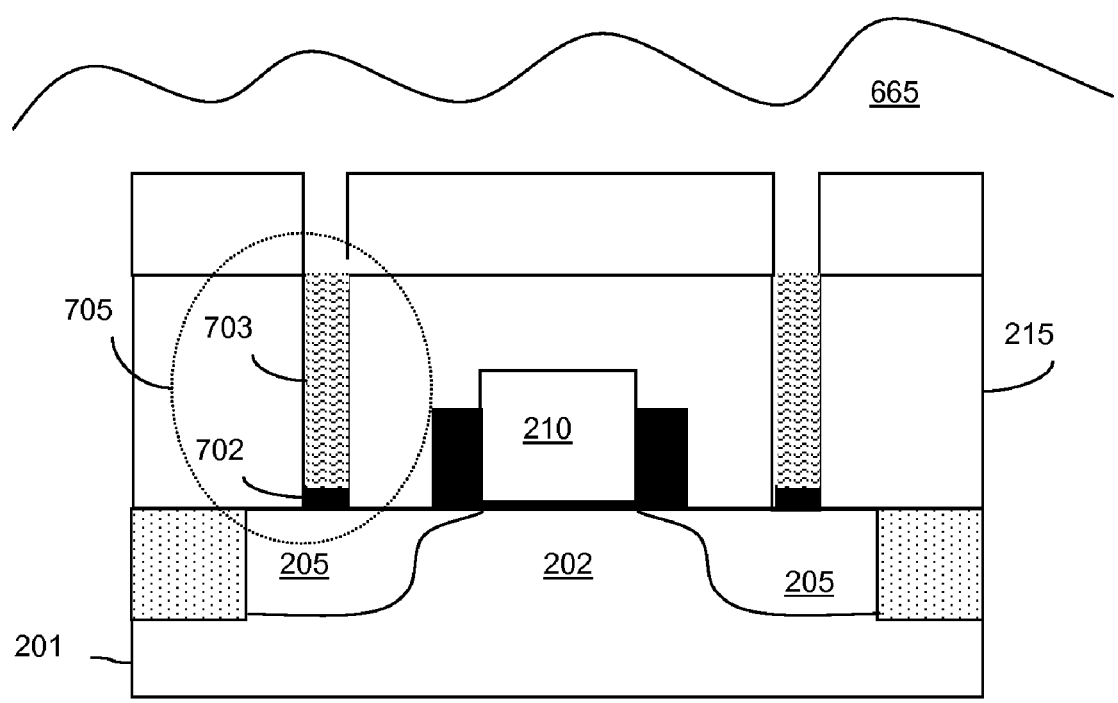
FIG. 8 is a cross-section diagram illustrating a contact to a diffusion region of a semiconductor substrate.

If plating 702 does occur (i.e., if the flow of electrons 611 does pass into the electroplating solution 660, as determined at process 112 of FIG. 1 and illustrated in FIG. 7b), then at process 114 of FIG. 1 the electroplating process 110 can be continued in order to fill the remaining portion of the contact opening 220 with at least one conductive material 703 (i.e., with the same material or one or more different materials), thereby completing contact 705 formation (see FIG. 8). For example, the electroplating process 114 can comprise performing a first electroplating process in order to plate a conductive barrier layer 702 in the contact opening 220 on the diffusion region 205. This conductive barrier layer 702 can, for example, comprise any suitable metal or metal alloy layer capable of preventing electro-migration, such as nickel (Ni), palladium (Pd), platinum (Pt). Once plating of the barrier layer 702 occurs, a second electroplating process (i.e., with a different electroplating solution and different anode) can be performed in order to plate an additional conductive layer 703 on the barrier layer 702. The additional conductive layer 703 can be different from the barrier layer 702 and can comprise any suitable contact metal or contact metal alloy layer, such as copper (Cu) or aluminum (Al).

Figure 9:
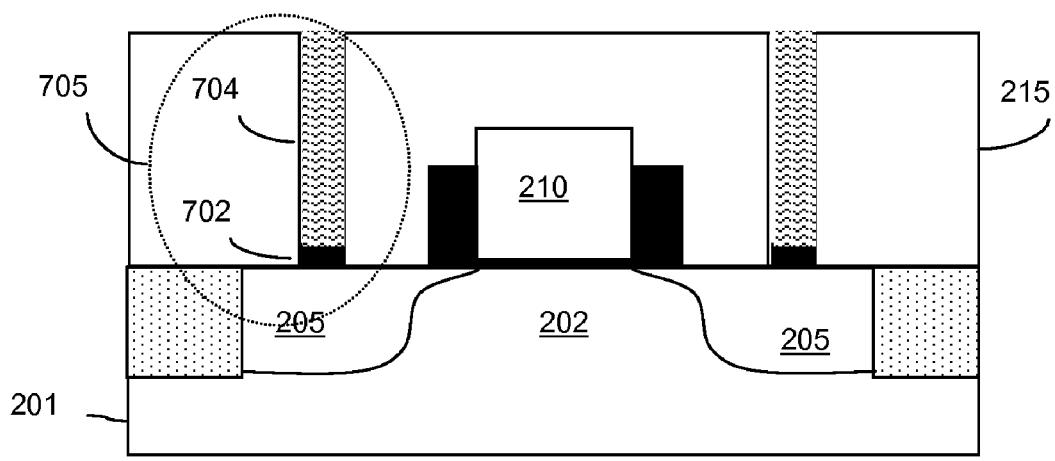
FIG. 9 is a cross-section diagram illustrating another contact to a diffusion region of a semiconductor substrate.

Alternatively, if plating occurs, then at process 116 of FIG. 1 the electroplating process 110 can be terminated and the remaining portion of the contact opening 220 can be filled with at least one conductive material 704 (i.e., with the same material or with one or more different materials) using an alternative deposition process, thereby completing contact 705 formation (see FIG. 9). For example, the electroplating process 110 can similarly comprise plating a conductive barrier layer 702 in the contact opening 220 on the diffusion region 205. This conductive barrier layer 702 can, for example, comprise any suitable metal or metal alloy layer capable of preventing electro-migration, such as nickel (Ni), palladium (Pd), platinum (Pt). Once plating of the conductive barrier layer 702 occurs, then an additional conductive layer 704 can be deposited (e.g., by sputtering, by physical vapor deposition (PVD), by chemical vapor deposition (CVD), by atomic layer deposition (ALD), etc.) in the contact opening 220 on the conductive barrier layer 702. The additional conductive layer 704 can be different from the barrier layer 702 and comprise any suitable contact metal or contact metal alloy layer, such as copper (Cu) or aluminum (Al).

The method embodiments of the present invention are not, however, limited to contact level metallization. That is, the method embodiments can also be used to form various other types of conductive structures (e.g., interconnects, fuses, anti-fuses, capacitors, etc.) at all metal levels (e.g., M1, V1, M2, etc.). For example, another method embodiment also comprises providing a substrate at process 102 of FIG. 1. However, in this case, the substrate 301 comprises a semiconductor layer 303 (e.g., a semiconductor wafer) and a metal layer 305 above and electrically connected to (e.g., by one or more interconnects 316 and, as necessary, additional metal layers 317) the semiconductor layer 303 (see FIG. 10).

Figure 10:
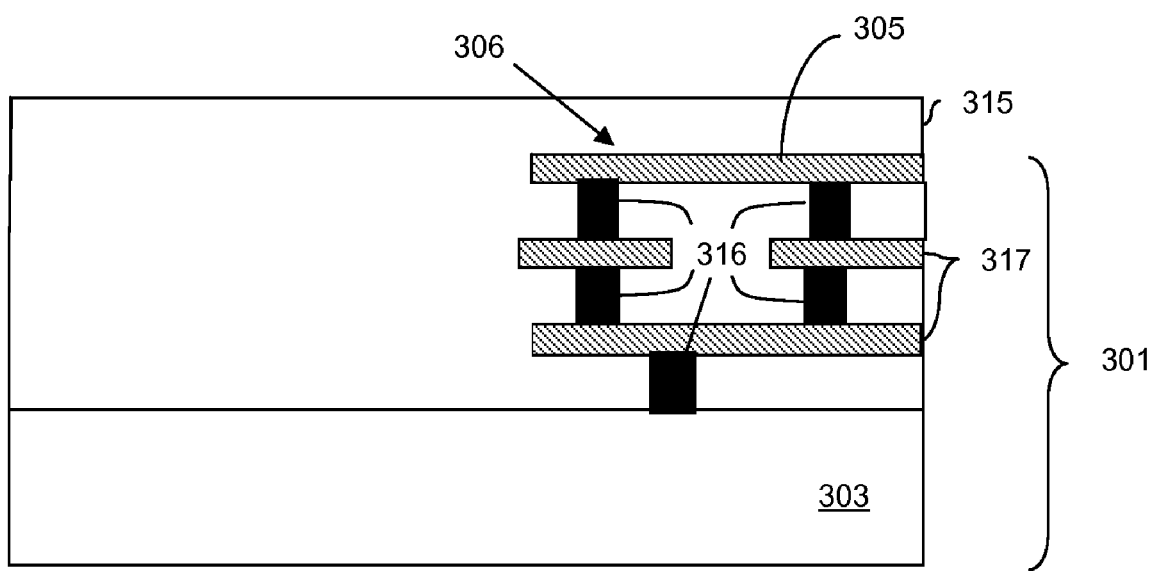
FIG. 10 is a cross-section diagram illustrating a process step in the method of FIG. 1 used to form a conductive structure on a metal layer above a semiconductor substrate.
Figure 11A:
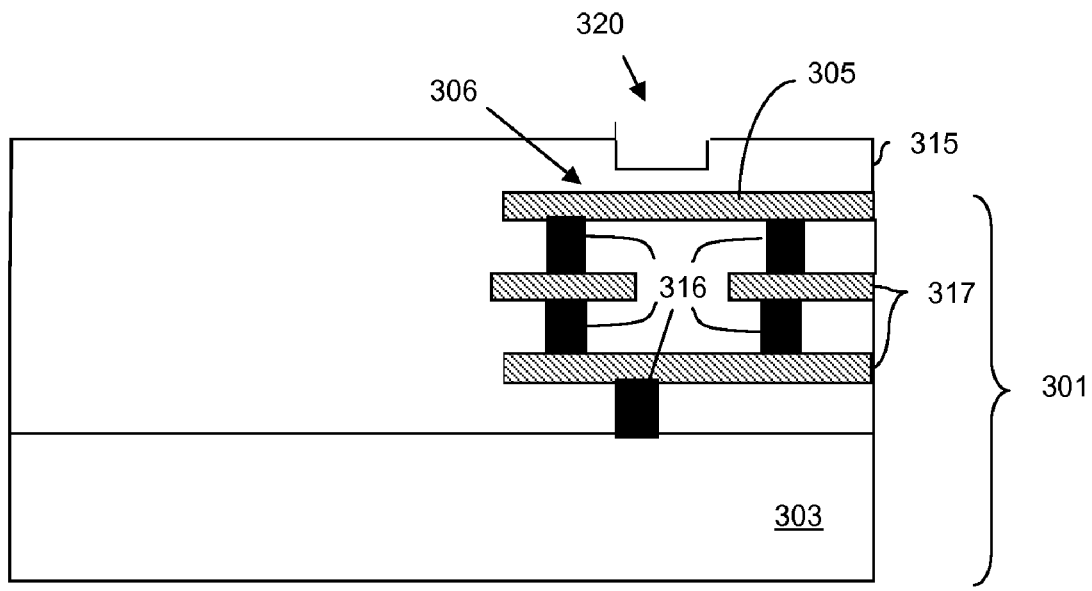
FIG. 11a is a cross-section diagram illustrating a process step in the method of FIG. 1 used to form a conductive structure on a metal layer above a semiconductor substrate.
Figure 11B:
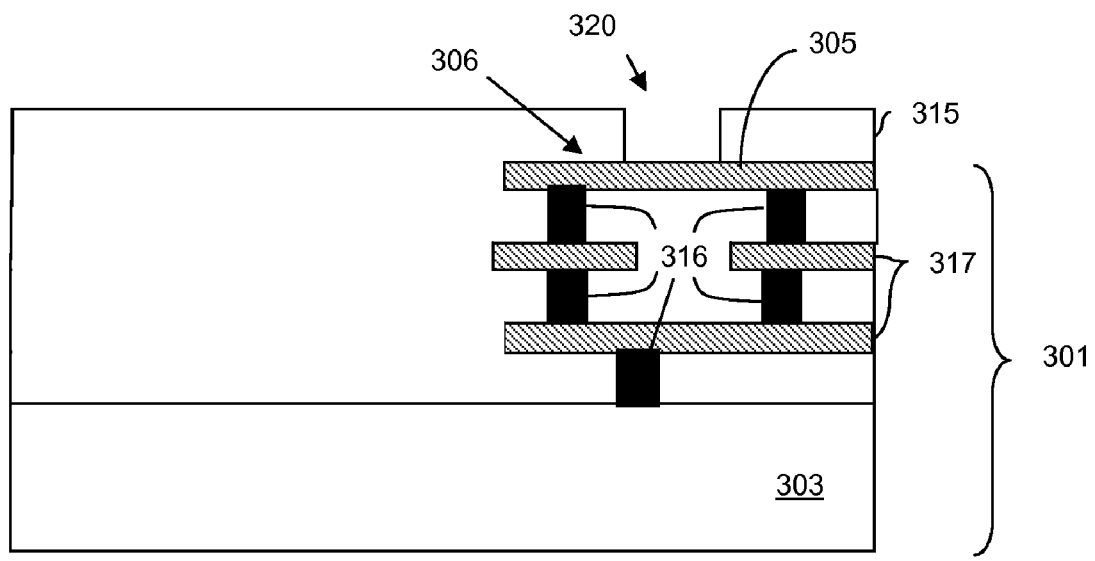
FIG. 11b is a cross-section diagram illustrating a process step in the method of FIG. 1 used to form a conductive structure on a metal layer above a semiconductor substrate.

At process 104 of FIG. 1, a dielectric layer 315 (e.g., a silicon dioxide layer or other suitable inter level dielectric) is formed on the top surface 306 of the substrate 301 adjacent to (i.e., immediately above) the metal layer 305 (see FIG. 10). Then, at processes 106-108 of FIG. 1, conventional lithographic patterning and etch processes are performed in order to form an opening 320 in the dielectric layer 315 aligned above the metal layer 305. Specifically, a photoresist layer is formed and lithographically patterned. Next, an etch process (e.g., a reactive ion etch (RIE) process) is performed so as to form an opening 320 in the dielectric layer 315 for the formation of a conductive structure (e.g., an interconnect, an anti-fuse, a fuse, a capacitor, etc.). The RIE process is designed to open the dielectric layer 315, thereby exposing the metal layer 305, as illustrated in FIG. 11b. However, due to varying process conditions, the resulting opening 320 may not in fact extend to the metal layer 305 (i.e., patterning integrity may be comprised), as illustrated in FIG. 11a.

Figure 6:
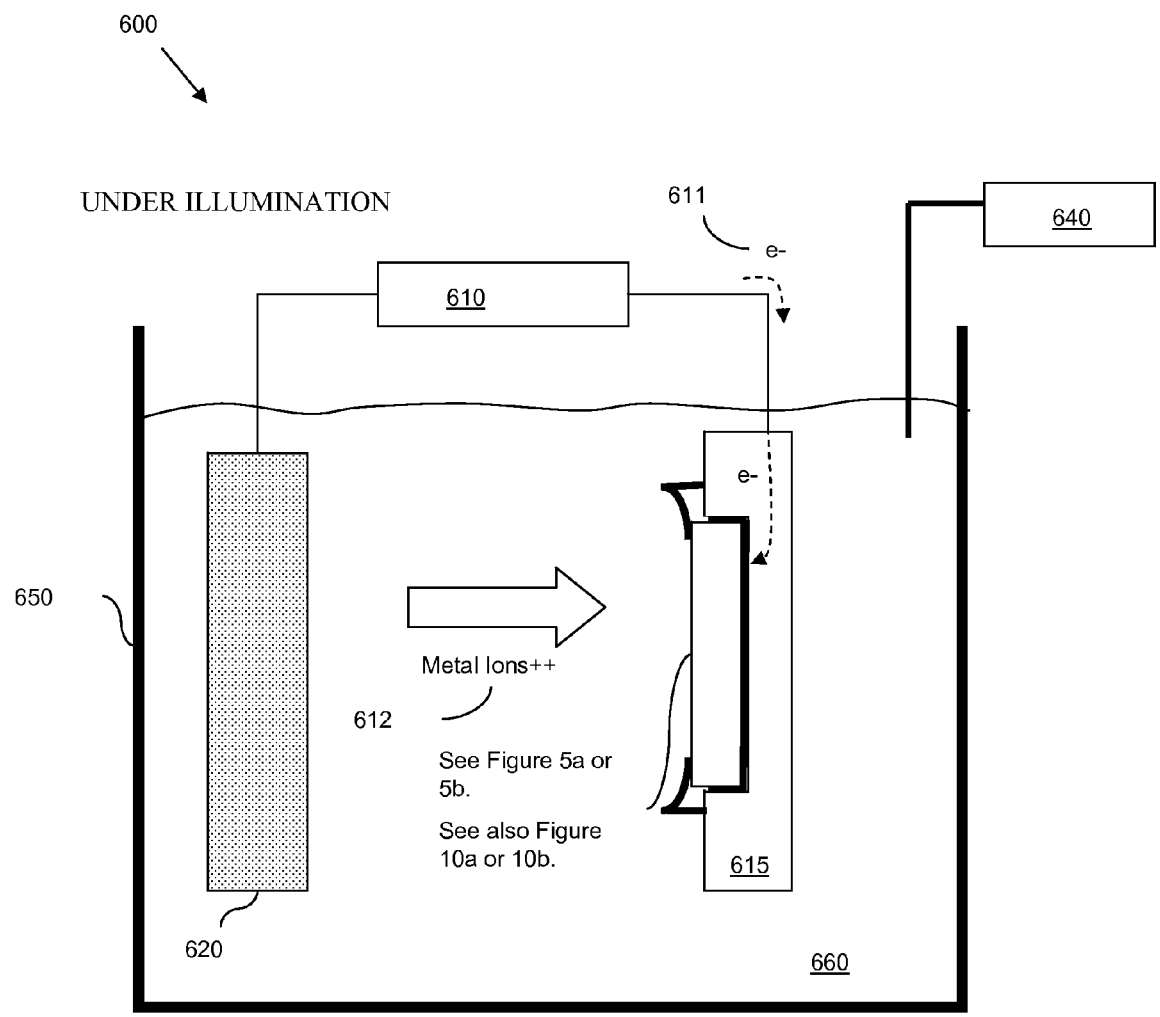
FIG. 6 is an exemplary electroplating circuit that can be used in conjunction with the method of FIG. 1.

Therefore, at process 110 of FIG. 1, following the lithographic patterning and etch processes 106-108, an electroplating process is performed in the same manner as described in detail above and illustrated in FIG. 6. Specifically, an electroplating circuit 600 is established in which the resulting structure of FIG. 10a or 10b is submerged in an electroplating solution 660 and, using a power source 610 and rack 615, a current is applied to the semiconductor layer 303 (e.g., applied to the back side 306 of the semiconductor wafer directly or to a contact on the back side 306 of the semiconductor wafer) such that a flow of electrons 611 is established through the semiconductor layer 303 (and, if necessary, any intervening interconnects 316 and/or additional metal layers 317) to the subject metal layer 305. This electroplating process can be performed under illumination so as to enhance electron flow and ensure that the electron flow 611 passes to the subject metal layer 305.

Figure 12A:
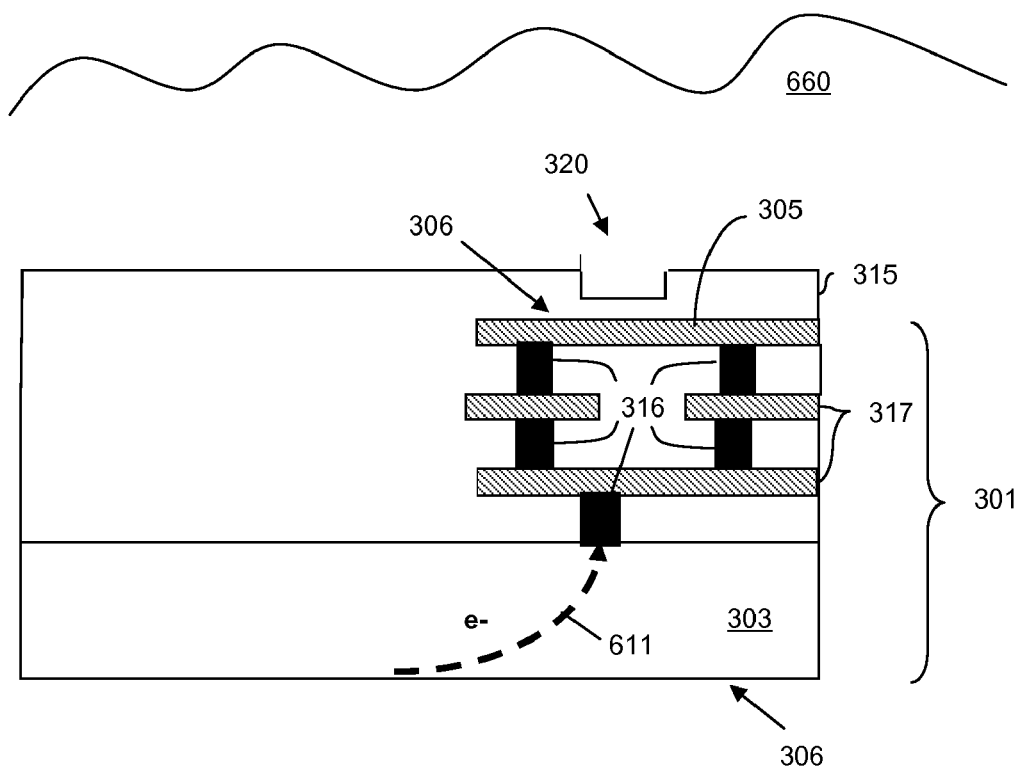
FIG. 12a is a cross-section diagram illustrating a process step in the method of FIG. 1 used to form a conductive structure on a metal layer above a semiconductor substrate.
Figure 12B:
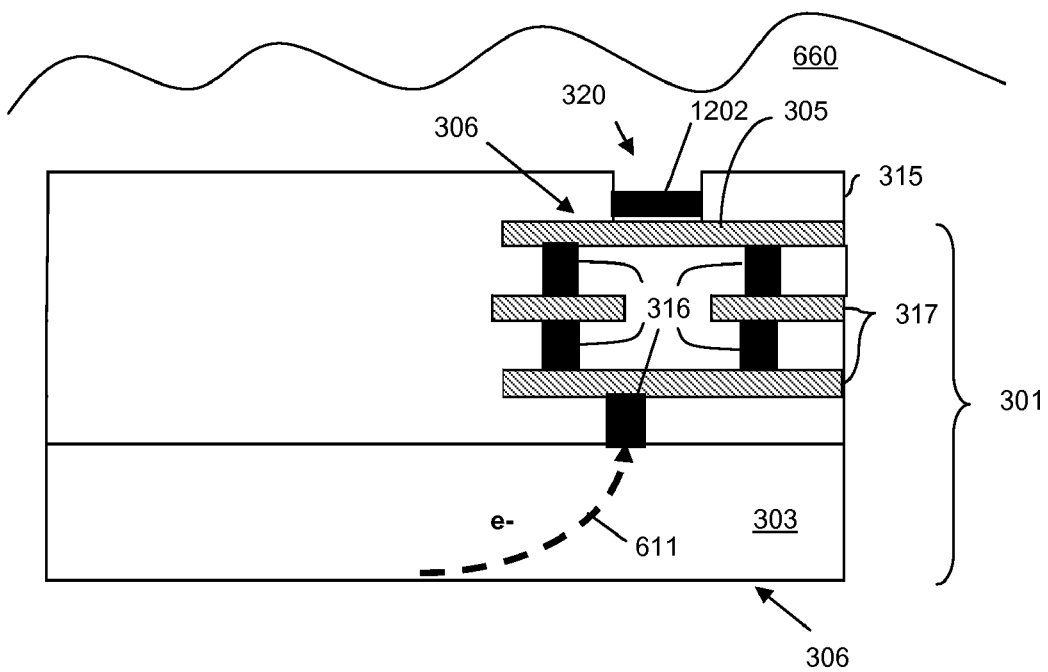
FIG. 12b is a cross-section diagram illustrating a process step in the method of FIG. 1 used to form a conductive structure on a metal layer above a semiconductor substrate.
Figure 13:
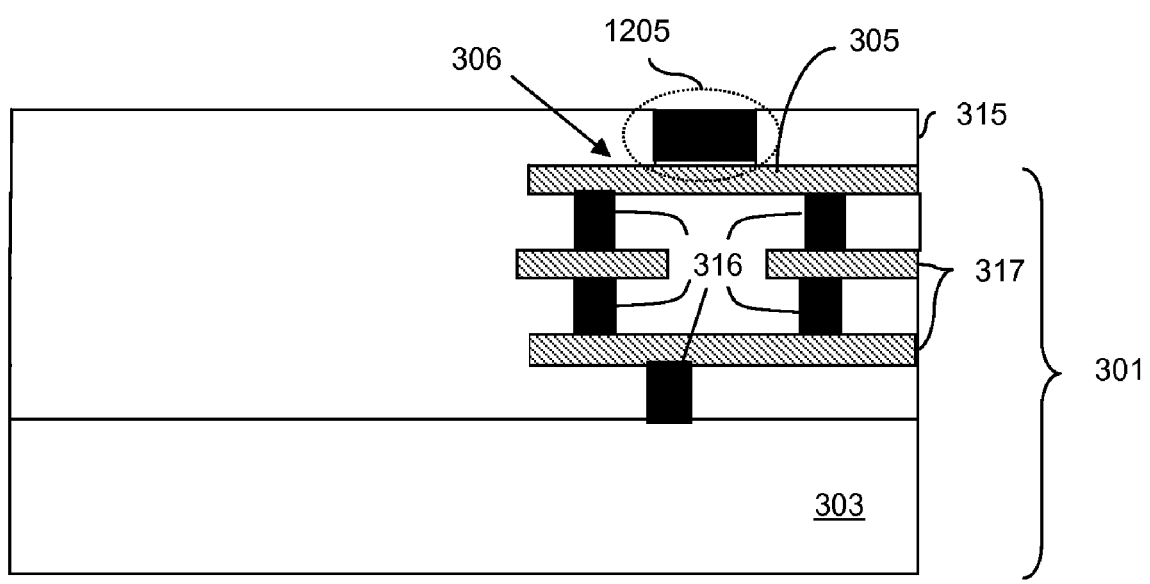
FIG. 13 is a cross-section diagram illustrating an exemplary conductive structure on a metal layer above a semiconductor substrate.

As with the previously described embodiments, at process 112 of FIG. 1, the flow of electrons 611 into the electroplating solution 660 is monitored (see FIG. 6 and detailed discussion above). In this case, electron flow 611 into the electroplating solution 660 causes plating 1202 to occur on the metal layer 305 within the opening 320 and is an indication that the opening 320 does in fact extend through the dielectric layer 315 to the metal layer 305, as illustrated in FIG. 12b. If plating does not occur (i.e., if the flow of electrons 611 does not pass into the electroplating solution 660, due to underetch, as determined at process 112 of FIG. 1 and illustrated in FIG. 12a), then the etching, electroplating and monitoring processes 108-112 are repeated. If plating does occur (as determined at process 112 of FIG. 1 and illustrated in FIG. 12b), then at process 114 of FIG. 1 the electroplating process can be continued in order to fill the remaining portion of the opening 320 with at least one conductive material (i.e., with the same material or with one or more different materials), thereby completing formation of the conductive structure 1205 (see FIG. 13). Alternatively, if plating occurs, then at process 116 the electroplating process can be terminated and the remaining portion of the opening 320 can be filled with at least one conductive material (i.e., with the same material or with one or more different materials) using an alternative deposition process (e.g., sputtering, physical vapor deposition (PVD), chemical vapor deposition (CVD), atomic layer deposition (ALD), etc.), thereby completing formation of the conductive structure 1205 (see FIG. 13). Consequently, the disclosed method can be used to form any number of middle of the line (MOL) and back end of the line (BEOL) on-chip conductive structures, including but not limited to, contacts, interconnects, anti-fuses, fuses, capacitors, etc.

Therefore, disclosed above are embodiments of a method that both monitors patterning integrity of etched openings (i.e., ensures that lithographically patterned and etched openings are complete) and forms on-chip conductive structures (e.g., contacts, interconnects, fuses, anti-fuses, capacitors, etc.) within such openings. The method embodiments incorporate an electro-deposition process to provide both the means by which pattern integrity of etched openings can be monitored and also the metallization required for the formation of conductive structures within the openings. Specifically, during the electro-deposition process, electron flow is established by applying a current to the back side of the semiconductor wafer, thus, eliminating the need for a seed layer. Electron flow through the wafer and into the electroplating solution is then monitored and used as an indicator of electroplating in the etched openings and, thereby, as an indicator that the openings are completely etched. Specifically, this invention provides a significant advantage over prior art solutions, because with this backside plating technique if a via is not completely etched it will not fill at all. This is contrary to conventional plating techniques which fill vias whether or not they are completely etched. Thus, due to the electroplating, monitoring and repeating (as necessary) steps that are incorporated into this method, improved fabrication yield of the desired conductive structures (e.g., approximately 100% fabrication yield) is assured.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the embodiments can be practiced with modification within the spirit and scope of the appended claims.

What is claimed is:

1. A method of forming a conductive structure on a semiconductor chip, said method comprising:
    providing a substrate having a top surface and a conductive portion at said top surface;
    forming a dielectric layer on said top surface of said substrate adjacent to said conductive portion;
    patterning and etching an opening in said dielectric layer above said conductive portion;
    performing an electroplating process using an electroplating solution and a current applied to said substrate such that an electron flow is established through said substrate to said conductive portion; and
    during said electroplating process, monitoring said electron flow to determine if said electron flow passes into said electroplating solution causing plating to occur in said opening and indicating that said opening extends through said dielectric layer to said conductive portion.

2. The method according to claim 1, further comprising, if said plating occurs, continuing said performing of said electroplating process so as to fill said opening with at least one conductive material.

3. The method according to claim 1, further comprising, if said plating occurs, terminating said performing of said electroplating process and filling said opening with at least one conductive material using an alternative process.

4. The method according to claim 1, further comprising, if said plating does not occur, repeating said etching, said performing of said electroplating process and said monitoring of said electron flow.

5. The method according to claim 4, wherein said repeating ensures improves fabrication yield.

6. The method according to claim 1, wherein said electroplating process is performed under illumination so as to enhance said electron flow through said substrate to said conductive portion.

7. The method according to claim 1, wherein said current is applied to a back side of said substrate opposite said top surface.

8. A method of forming a contact on a semiconductor chip, said method comprising:
   providing a semiconductor substrate having top surface and comprising a diffusion region at said top surface;
   forming a dielectric layer on said top surface of said semiconductor substrate adjacent to said diffusion region;
   patterning and etching a contact opening in said dielectric layer above said diffusion region;
   performing an electroplating process using an electroplating solution and a current applied to said semiconductor substrate to establish an electron flow through said semiconductor substrate to said diffusion region; and
   during said electroplating process, monitoring said electron flow to determine if said electron flow passes into said electroplating solution causing plating to occur in said contact opening and indicating that said contact opening extends through said dielectric layer to said diffusion region.

9. The method according to claim 8, further comprising, if said plating occurs, continuing said performing of said electroplating process so as to fill said contact opening with at least one conductive material.

10. The method according to claim 8, wherein said electroplating comprises:
    performing a first electroplating process to plate a barrier metal layer in said contact opening on said diffusion region; and
    performing a second electroplating process to plate an additional metal layer in said contact opening on said barrier metal layer.

11. The method according to claim 8, further comprising, if said plating occurs, terminating said performing of said electroplating process and filling said opening with at least one conductive material using an alternative process.

12. The method according to claim 8, wherein said electroplating comprises plating a barrier metal layer in said contact opening on said diffusion region; and
    wherein said method further comprises, after said electroplating, depositing an additional metal layer in said contact opening on said barrier metal layer.

13. The method according to claim 8, further comprising, if said plating does not occur, repeating said etching, said performing of said electroplating process and said monitoring of said electron flow.

14. The method according to claim 13, wherein said repeating improves fabrication yield.

15. The method according to claim 8, wherein said electroplating is performed under illumination so as to enhance said electron flow through said semiconductor substrate to said diffusion region.

16. The method according to claim 8, wherein said current is applied to a back side of said substrate opposite said top surface.

17. A method of forming a conductive structure on a semiconductor chip, said method comprising:
    providing a substrate comprising a semiconductor layer and a metal layer above and electrically connected to said semiconductor layer;
    forming a dielectric layer on a top surface of said substrate adjacent to said metal layer;
    patterning and etching an opening in said dielectric layer above said metal layer;
    performing an electroplating process using an electroplating solution and a current applied to said semiconductor layer to establish an electron flow through said semiconductor layer to said metal layer; and
    during said electroplating process, monitoring said electron flow to determine if said electron flow passes into said electroplating solution causing plating to occur in said opening and indicating that said opening extends through said dielectric layer to said metal layer.

18. The method according to claim 17, further comprising, if said plating occurs, continuing said performing of said electroplating process so as to fill said opening with at least one conductive material.

19. The method according to claim 17, further comprising, if said plating occurs, terminating said performing of said electroplating process and filling said opening with at least one conductive material using an alternative process.

20. The method according to claim 17, further comprising, if said plating does not occur, repeating said etching, said performing of said electroplating process and said monitoring of said electron flow.

* * * * *